United States Patent
Wilson et al.

(10) Patent No.: US 11,264,205 B2
(45) Date of Patent: Mar. 1, 2022

(54) TECHNIQUES FOR DETERMINING AND CORRECTING FOR EXPECTED DOSE VARIATION DURING IMPLANTATION OF PHOTORESIST-COATED SUBSTRATES

(71) Applicant: APPLIED Materials, Inc., Santa Clara, CA (US)

(72) Inventors: Eric Donald Wilson, Gloucester, MA (US); George Gammel, Marblehead, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

(21) Appl. No.: 17/093,468

(22) Filed: Nov. 9, 2020

(65) Prior Publication Data

US 2021/0175048 A1 Jun. 10, 2021

Related U.S. Application Data

(60) Provisional application No. 62/944,811, filed on Dec. 6, 2019.

(51) Int. Cl.
*H01J 37/00* (2006.01)
*H01J 37/317* (2006.01)
(Continued)

(52) U.S. Cl.
CPC ........ *H01J 37/3171* (2013.01); *H01J 37/244* (2013.01); *H01J 37/256* (2013.01);
(Continued)

(58) Field of Classification Search
USPC ....................................... 250/492.3
See application file for complete search history.

(56) References Cited

U.S. PATENT DOCUMENTS

| | | | | |
|---|---|---|---|---|
| 4,587,433 A | * | 5/1986 | Farley ................. | H01J 37/3171 250/492.2 |
| 5,760,409 A | * | 6/1998 | Chen .................. | H01J 37/3171 250/492.21 |

(Continued)

FOREIGN PATENT DOCUMENTS

| KR | 10-2011-0015523 A | 2/2011 |
|---|---|---|
| WO | 2014-179674 A1 | 11/2014 |

OTHER PUBLICATIONS

International Search Report dated Mar. 15, 2021, for the International Patent Application No. PCT/US2020/061704, filed on Nov. 22, 2020, 3 pages.

(Continued)

*Primary Examiner* — Phillip A Johnston
(74) *Attorney, Agent, or Firm* — Kacvinsky Daisak Bluni PLLC

(57) ABSTRACT

A method, including using an implant recipe to perform an implant by scanning an ion beam along a first axis over a substrate, coated with a photoresist layer, while the substrate is scanned along a perpendicular axis; measuring an implant current (I) during the implant, using a first detector, positioned to a side of a substrate position; determining a value of a difference ratio (I−B)/(B), based upon the implant current, where B is current measured by the first detector, during a calibration at base pressure; determining a plurality of values of a current ratio (CR) for the plurality of instances, based upon the difference ratio, the current ratio being a ratio of the implant current to a current measured by a second detector, positioned over the substrate position, during the calibration; and adjusting scanning the ion beam, scanning of the substrate, or a combination thereof, based upon the current ratio.

18 Claims, 9 Drawing Sheets

BASE CLF CURRENT = CLF CURRENT AT BASE PRESSURE

(51) Int. Cl.
*H01J 37/256* (2006.01)
*H01J 37/244* (2006.01)
*H01J 37/304* (2006.01)

(52) U.S. Cl.
CPC ... *H01J 37/304* (2013.01); *H01J 2237/24535* (2013.01); *H01J 2237/24564* (2013.01); *H01J 2237/30483* (2013.01); *H01J 2237/31703* (2013.01)

(56) References Cited

U.S. PATENT DOCUMENTS

| | | | | |
|---|---|---|---|---|
| 6,657,209 | B2* | 12/2003 | Halling | H01J 37/304 |
| | | | | 250/492.21 |
| 6,797,967 | B1* | 9/2004 | Tse | H01J 37/3171 |
| | | | | 250/492.1 |
| 6,965,116 | B1 | 11/2005 | Wagner et al. | |
| 7,755,066 | B2 | 7/2010 | Evans | |
| 10,361,066 | B2* | 7/2019 | Sasaki | H01J 37/3171 |
| 10,431,421 | B2* | 10/2019 | Wilson | H01J 37/3171 |
| 2008/0073584 | A1 | 3/2008 | Callahan et al. | |
| 2011/0297842 | A1 | 12/2011 | Ninomiya et al. | |
| 2016/0035634 | A1 | 2/2016 | Tian et al. | |
| 2018/0068828 | A1 | 3/2018 | Halling | |

OTHER PUBLICATIONS

Written Opinion dated Mar. 15, 2021, for the International Patent Application No. PCT/US2020/061704, filed on Nov. 22, 2020, 3 pages.

* cited by examiner

BASE CLF CURRENT = CLF CURRENT AT BASE PRESSURE

BASE CLF CURRENT = CLF CURRENT AT BASE PRESSURE

```
500 ─┐
     │  ┌─510
     ▼
┌─────────────────────────────────────────────────────────────────────────┐
│ MEASURE PLURALITY OF VALUES OF CURRENT RATIOS, WHERE CURRENT RATIOS     │
│ REPRESENT RATIO OF CURRENT MEASURED BY FIRST DETECTOR, LOCATED TO SIDE  │
│ OF SUBSTRATE, AND CURRENT MEASURED BY SECOND DETECTOR, LOCATED OVER     │
│ SUBSTRATE POSITION, AS FUNCTION OF PRESSURE OVER GIVEN PRESSURE RANGE   │
│ IN ENDSTATION HOUSING SUBSTRATE, DURING GAS RAMP CALIBRATION            │
└─────────────────────────────────────────────────────────────────────────┘
                                    │   ┌─520
                                    ▼
┌─────────────────────────────────────────────────────────────────────────┐
│ DURING GAS RAMP CALIBRATION, CALCULATE PLURALITY OF VALUES OF           │
│ DIFFERENCE RATIO OVER GIVEN PRESSURE RANGE, DEFINED BY RATIO OF         │
│ DIFFERENCE BETWEEN INSTANTANEOUS CURRENT MEASURED AT GIVEN PRESSURE     │
│ AND BASE CURRENT, MEASURED BY FIRST DETECTOR AT START OF GAS RAMP       │
│ CALIBRATION, DIVIDED BY BASE CURRENT                                    │
└─────────────────────────────────────────────────────────────────────────┘
                                    │   ┌─530
                                    ▼
┌─────────────────────────────────────────────────────────────────────────┐
│ DETERMINE VARIATION OF DIFFERENCE RATIO WITH CURRENT RATIO BASED UPON   │
│ GAS RAMP CALIBRATION                                                    │
└─────────────────────────────────────────────────────────────────────────┘
                                    │   ┌─540
                                    ▼
┌─────────────────────────────────────────────────────────────────────────┐
│ PERFORM IMPLANT BY SCANNING ION BEAM ALONG FIRST AXIS OVER SUBSTRATE    │
│ COATED WITH PHOTORESIST LAYER, WHILE SCANNING SUBSTRATE ALONG SECOND    │
│ AXIS, PERPENDICULAR TO FIRST AXIS                                       │
└─────────────────────────────────────────────────────────────────────────┘
                                    │   ┌─550
                                    ▼
┌─────────────────────────────────────────────────────────────────────────┐
│ MEASURE IMPLANT CURRENT AT PLURALITY OF INSTANCES DURING SCANNING OF    │
│ ION BEAM AND SUBSTRATE USING FIRST DETECTOR                             │
└─────────────────────────────────────────────────────────────────────────┘
                                    │   ┌─560
                                    ▼
┌─────────────────────────────────────────────────────────────────────────┐
│ DETERMINE VALUE OF DIFFERENCE RATIO AT PLURALITY OF INSTANCES BASED     │
│ UPON MEASURED IMPLANT CURRENT DURING SCANNING OF ION BEAM AND SUBSTRATE │
└─────────────────────────────────────────────────────────────────────────┘
                                    │   ┌─570
                                    ▼
┌─────────────────────────────────────────────────────────────────────────┐
│ DETERMINE CURRENT RATIO (CR) BETWEEN FIRST DETECTOR AND SECOND DETECTOR │
│ AT PLURALITY OF INSTANCES DURING SCANNING, BY MAPPING VALUE OF          │
│ DIFFERENCE RATIO TO DIFFERENCE RATIO/CURRENT RATIO CURVE                │
└─────────────────────────────────────────────────────────────────────────┘
                                    │   ┌─580
                                    ▼
┌─────────────────────────────────────────────────────────────────────────┐
│ CALCULATE CORRECTED CURRENT BASED ON DETERMINED CR AT PLURALITY OF      │
│ INSTANCES DURING SCANNING, AND ADJUSTING SCANNING OF SUBSTRATE OR OF    │
│ ION BEAM BASED UPON THE CORRECTED CURRENT                               │
└─────────────────────────────────────────────────────────────────────────┘
```

FIG. 5

TECHNIQUES FOR DETERMINING AND CORRECTING FOR EXPECTED DOSE VARIATION DURING IMPLANTATION OF PHOTORESIST-COATED SUBSTRATES

RELATED APPLICATIONS

This Application claims priority to U.S. Provisional Patent Application Ser. No. 62/944,811, filed Dec. 6, 2019, entitled TECHNIQUES FOR DETERMINING AND CORRECTING FOR EXPECTED DOSE VARIATION DURING IMPLANTATION OF PHOTORESIST-COATED SUBSTRATES, and incorporated by reference herein in its entirety.

FIELD

The present embodiments relate to processing apparatus and methods, and more particularly, to methods to control beam current in ion implantation processes.

BACKGROUND

In the present day, various types of processing apparatus are employed to treat or process substrates with ions. For processing substrates such as semiconductor substrates, ions may be used to etch layers or features on a substrate. Ions may also be used to deposit a layer or structures on a substrate, to implant a species into a substrate, or to amorphize a substrate. Techniques have also been developed to monitor processing of a substrate in order to control the processing of a substrate.

In order to provide accurate dose control for ion implantation of a substrate using a scanned spot beam, current monitors may be provided at or near a substrate, such as Faraday cup monitors. In some ion implanters, real-time monitoring of a scanned spot beam is performed to estimate ion dose provided to a substrate. A current sensor such as a Faraday cup may be provided adjacent to a substrate to intercept a spot beam scanned back and forth along a first direction while a substrate is scanned in a perpendicular direction. The real-time monitoring may be used to adjust the scanning of a spot beam when the measured ion dose at the current sensor does not match a target ion dose, for example.

In some cases, to ensure proper ion dose is delivered to a substrate during implantation, a current monitor positioned near the substrate, may perform current measurements. In some cases a closed loop Faraday (CLF) monitor may be disposed outside of a substrate position just upstream of the substrate position, and may intercept an ion beam and be used to measure integrated current as the ion beam is scanned along a given direction. This integrated current may be compared to integrated current measured by a monitor such as a profile current detector (PF), positioned at the substrate plane, in order to determine a ratio of integrated CLF current to integrated PF current. The PF detector may be placed, for example at a position corresponding to the center position of a substrate. This determined ratio may be employed later to ensure repeatability in providing non-uniform ion dose between different substrates, and for controlling up/down substrate uniformity.

In order to ensure proper beam current or ion dose is delivered to a substrate during ion implantation, the CLF component may measure beam current during an implantation process, while being coupled to beam controllers to adjust beam current dynamically during implantation. Thus, a change in measured current at a CLF during implantation may trigger a signal to adjust beamline components to increase or decrease beam current being delivered to the substrate. For example, for a scanned spot beam, a change in measured CLF current may lead to a change is scan speed of a substrate, in order to adjust the effective beam current delivered to a given portion of the substrate.

Notably, while variations in the functioning of beamline components upstream of the substrate may affect beam current being delivered to the substrate during ion implantation, local variations during implantation in conditions surrounding the substrate are generally not accounted for, and therefore are not corrected for by known implantation systems using current monitors to adjust beam current.

With respect to these and other considerations the present improvements may have been needed.

SUMMARY

In one embodiment, a method is provided. The method may include using a first implant recipe to perform an implant by scanning an ion beam along a first axis over a substrate, coated with a photoresist layer, while the substrate is scanned along a second axis, perpendicular to the first axis, and measuring an implant current (I) during the implant at a plurality of instances, using a first detector, positioned to a side of a substrate position. The method may include determining at the plurality of instances a value of a difference ratio based upon the implant current, the difference ratio given by $(I-B)/(B)$, where B is current measured by the first detector, during a calibration at base pressure without the substrate present. The method may also include determining a plurality of values of a current ratio (CR) during the implant for the plurality of instances, respectively, based upon the difference ratio, the current ratio being a ratio of the implant current to a current measured by a second detector, positioned over the substrate position, during the calibration. The method may include adjusting the scanning the ion beam and/or the scanning of the substrate based upon the current ratio.

In another embodiment, an ion implanter may include an ion source to generate an ion beam according to an implant recipe, a scanner to scan the ion beam, a first detector and a second detector to measure current of the ion beam, a substrate stage to scan a substrate, and a controller to control the ion beam. The controller may be arranged to perform an implant by scanning the ion beam along a first axis over a substrate, coated with a photoresist layer, while the substrate is scanned along a second axis, perpendicular to the first axis, and measure an implant current (I) during the implant at a plurality of instances, using a first detector, positioned to a side of a substrate position. The controller may be arranged to determine at the plurality of instances a value of a difference ratio based upon the implant current, the difference ratio given by $(I-B)/(B)$, where B is current measured by the first detector, during a calibration at base pressure without the substrate present. The controller may further be arranged to determine a plurality of values of a current ratio (CR) for the plurality of instances during the implant, respectively, based upon the difference ratio, the current ratio being a ratio of the implant current to a current measured by a second detector, positioned over the substrate position, during the calibration. The controller may be arranged to adjust the scanning the ion beam, the scanning of the substrate, or a combination thereof, based upon the current ratio.

In another embodiment, a method of implanting a substrate, may include using a first implant recipe to perform an implant by scanning an ion beam along a first axis over a substrate, while the substrate is scanned along a second axis, perpendicular to the first axis, and measuring an implant current (I) during the implant, using a first detector, positioned to a side of a substrate position. The method may include determining a value of a difference ratio based upon the implant current, the difference ratio given by (I−B)/(B), where B is current measured by the first detector, during a calibration at base pressure. The method may further include determining a value of a current ratio (CR) during the implant, based upon the difference ratio, the current ratio being a ratio of the implant current to a current measured by a second detector, positioned over the substrate position, during the calibration; and adjusting the scanning the ion beam, the scanning of the substrate, or a combination thereof, based upon the current ratio.

BRIEF DESCRIPTION OF THE DRAWINGS

FIGS. 2A and 2C illustrate results of gas ramp measurements under two different conditions, while

FIG. 5 depicts an exemplary process flow; and

DETAILED DESCRIPTION

Figure 1A:
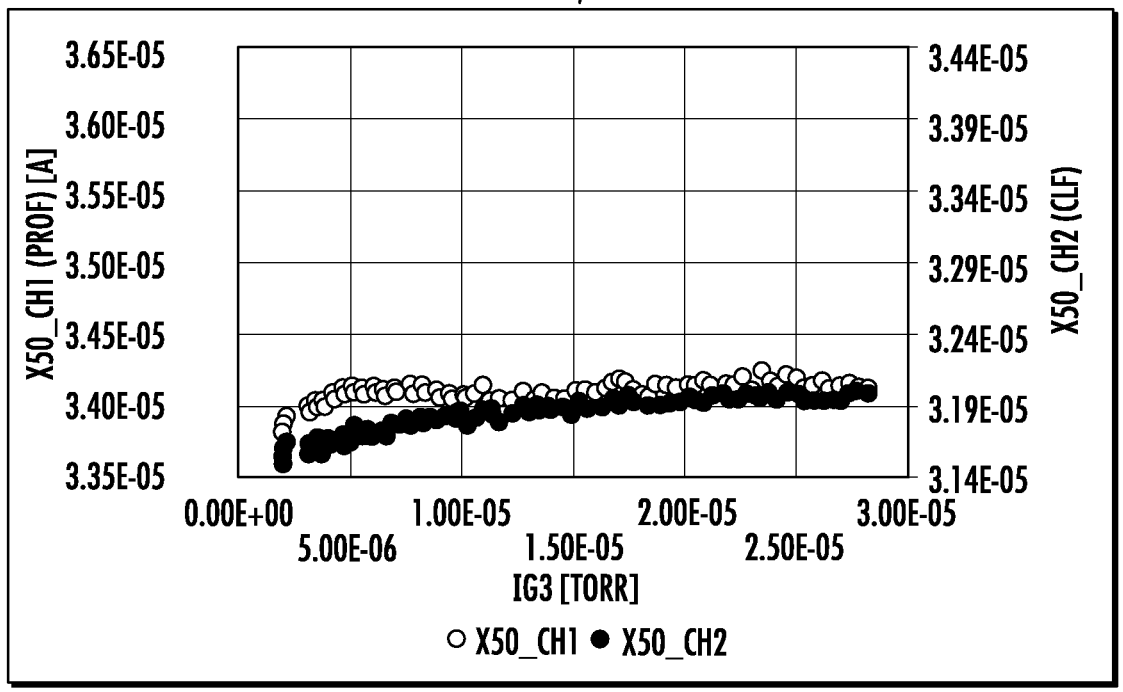
FIG. 1A-1F depicts variations of beam current monitor parameters as a function of gas pressure in an ion implanter during a gas ramp calibration.

The present embodiments will now be described more fully hereinafter with reference to the accompanying drawings, where some embodiments are shown. The subject matter of the present disclosure may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein provide novel processing apparatus and methods to generate controlled ion implantation of substrates.

In various embodiments, techniques are disclosed to account for variations in beam current parameters including CLF current and ratios, such as CLF current/PF current that may be induced during implantation of substrates, where pressure changes may take place near the substrate. As disclosed herein, experiments have been performed that have discovered that pressure changes induced by implantation of substrates including photoresist layers may systematically affect CLF current and other beam current parameters. By accounting for these effects in accordance with the present embodiments, the beam current delivered to a substrate may be more accurately controlled.

Figure 6:
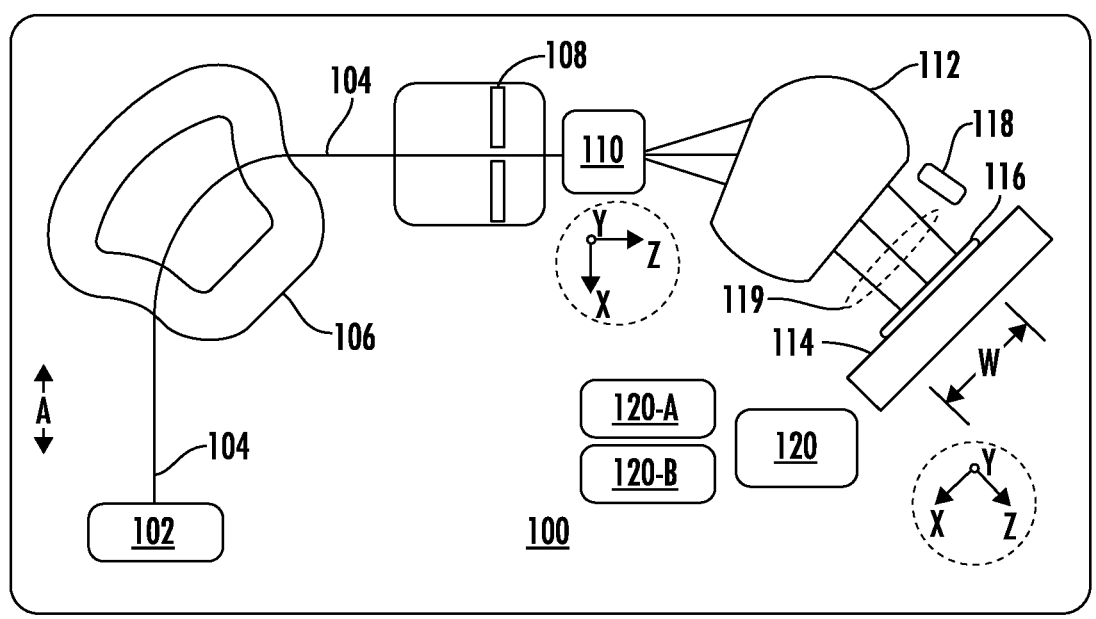
FIG. 6 depicts a top plan view in block form of a beamline ion implanter, in accordance with various embodiments of the disclosure.

FIG. 6 depicts a top plan view in block form of a beamline ion implanter, shown as the ion implanter 100, in accordance with various embodiments of the disclosure. The ion implanter 100 includes an ion source 102 configured to generate an ion beam 104. The ion beam 104 may be provided as a spot beam scanned along a direction, such as the X-direction. In the convention used herein, the Z-direction refers to a direction of an axis parallel to the central ray trajectory of an ion beam 104. Thus, the absolute direction of the Z-direction, as well as the X-direction, where the X-direction is perpendicular to the Z-direction, may vary at different points within the ion implanter 100 as shown. The ion beam 104 may travel through an analyzer magnet 106, mass resolving slit 108, and through a collimator 112 before impacting a substrate 116 disposed on substrate stage 114. The substrate stage 114 may be configured to scan the substrate 116 at least along the Y-direction in some embodiments. In the example shown in FIG. 1, the ion implanter 100 includes a beam scanner 110. When the ion beam 104 is provided as a spot beam, the beam scanner 110 may scan the ion beam 104 along the X-direction, producing a scanned ion beam, also scanned at the substrate along the X-direction. The width of the resulting scanned spot beam may be comparable to the width W of the substrate 116.

In various embodiments, the ion implanter 100 may be configured to deliver ion beams for "low" energy or "medium" energy ion implantation, such as a voltage range of 1 kV to 300 kV, corresponding to an implant energy range of 1 keV to 300 keV for singly charged ions. As discussed below, the scanning of an ion beam provided to the substrate 116 may be adjusted depending upon current measurements being made for a given scanned ion beam.

The ion implanter 100 further includes a current detector 118 such as a closed loop current detector, and in particular a closed loop Faraday current detector (CLF), for monitoring beam current provided to the substrate 116. The current detector 118 is disposed to intercept the ion beam outside of a substrate region 119 and may be configured to record a measured integrated current of the ion beam 104 during scanning of the ion beam 104.

The ion implanter 100 also includes a scan adjustment component 120. The scan adjustment component 120 may be coupled to the beam scanner 110 as well as current detector 118. The scan adjustment component 120 may be coupled to one or more components to adjust scanning of the ion beam 104, particularly in cases where measurements may be performed. The scan adjustment component 120 may include logic to generate an adjustment signal for adjusting scanning of the ion beam 104 based upon various inputs. In some instances, the logic of scan adjustment component 120 may be implemented in hardware, firmware, or a combination of hardware and software. In some examples the scan adjustment component 120 may include circuitry such as a controller 120-A and memory 120-B that is coupled to software to execute instructions for adjusting the scanning of ion beam 104. The embodiments are not limited in this context.

The present inventors have discovered that under certain configurations, when ion implantation is performed into photoresist-coated substrates, under closed loop control where current readings obtain from a CLF monitor are used to adjust implantation, the actual implanted ion dose deviates from the expected ion dose. Photoresist-coated substrates may be partially, mostly, or wholly covered with a photoresist layer, where the photoresist layer may act as an implant mask in some cases. Without limitation at to a specific theory, the deviation in actual implant dose from expected implant dose during photoresist implantation maybe due to fluctuations in local pressure in the ambient near the substrate 116 and near the current detector 118.

In accordance with various embodiments of the disclosure, the changes in pressure, such as in the substrate end station, due to photoresist implantation, are determined and adjusted for as described with respect to the figures to follow. A series of experiments have been conducted to document changes in detected current as a function of ambient pressure. Notably, pressure in a substrate station has been observed to rise from a background pressure to a pressure in the range of $1\,E^{-5}$ Torr to $5\,E^{-5}$ Torr or so during implantation of a photoresist-coated wafer (substrate). In accordance with some embodiments, to rapidly determine the variation of detected current with pressure, gas (used for wafer cooling) is purposely bled into a substrate platen with no substrate present. After a recipe sets up, the wafer cooling pressure is rapidly ramped up, in approximately one second in some cases, with no wafer on the substrate platen, until the end station pressure reaches a value comparable to the peak value encountered during a substrate implant procedure (with photoresist present, as described above). The pressure is then ramped back down. At the same time as the pressure in the end station is being ramped, an ion beam is scanned within the end station, and the CLF current and Profiler (PF) current (with the PF monitor placed at a Wafer Center position) are recorded, so the variation in current values including CLF current/PF current ratio how the ratio varies with the CLF current.

Figure 1B:
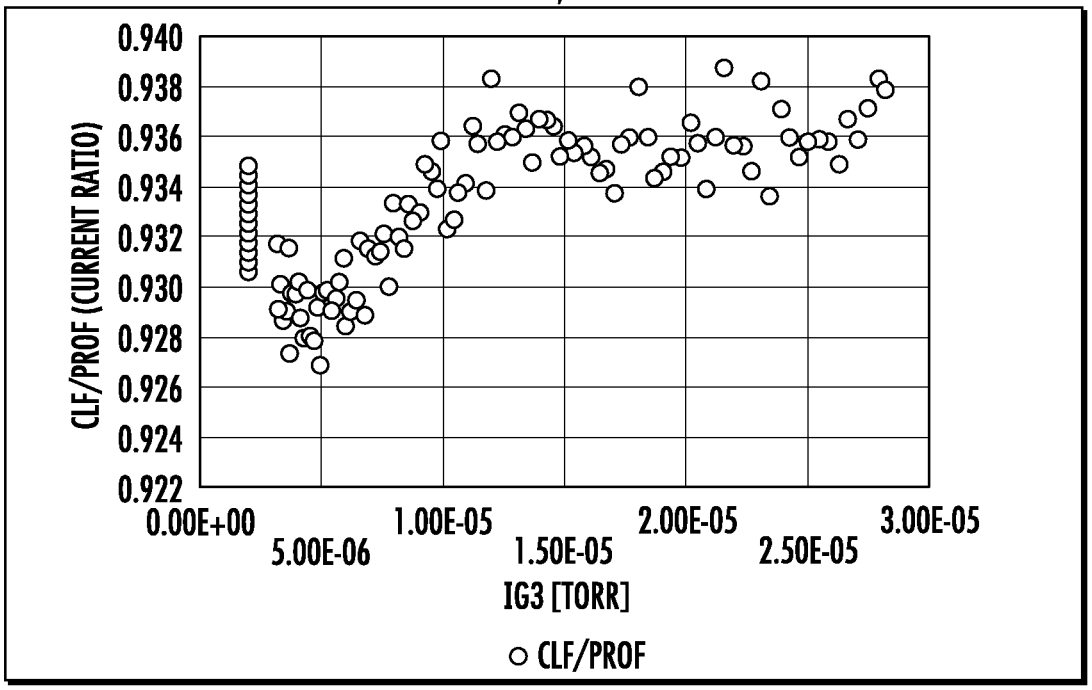
Figure 1C:
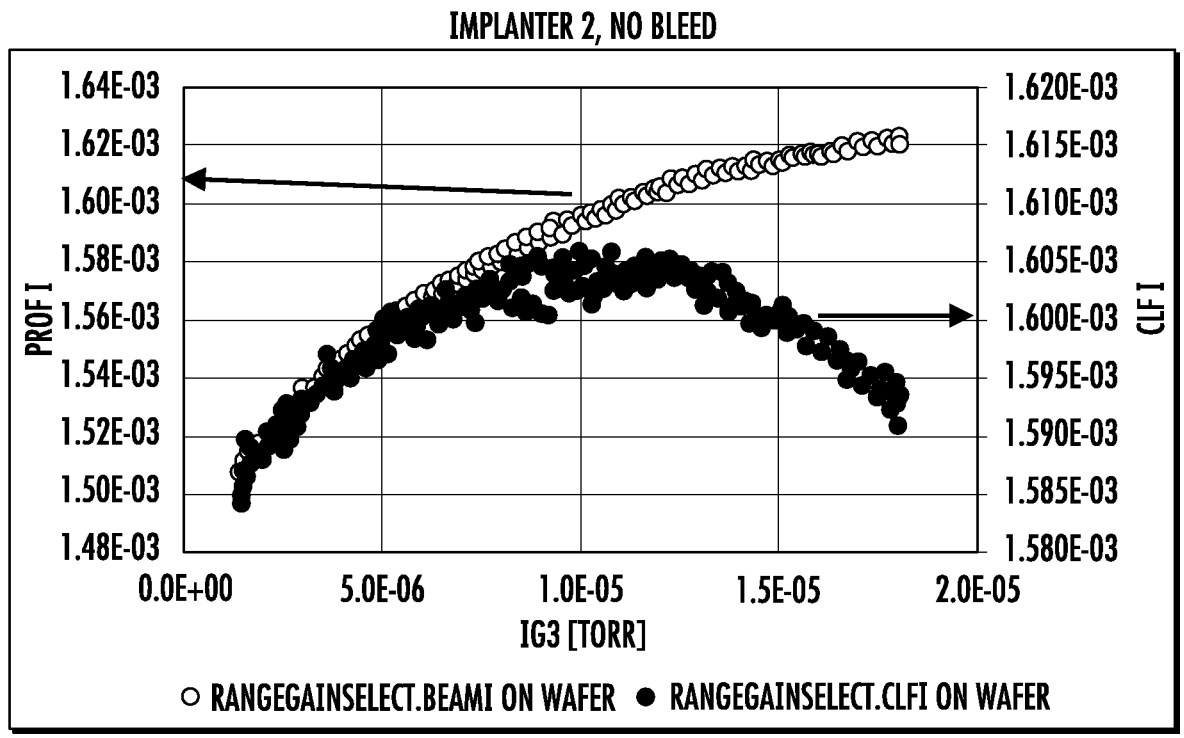
Figure 1D:
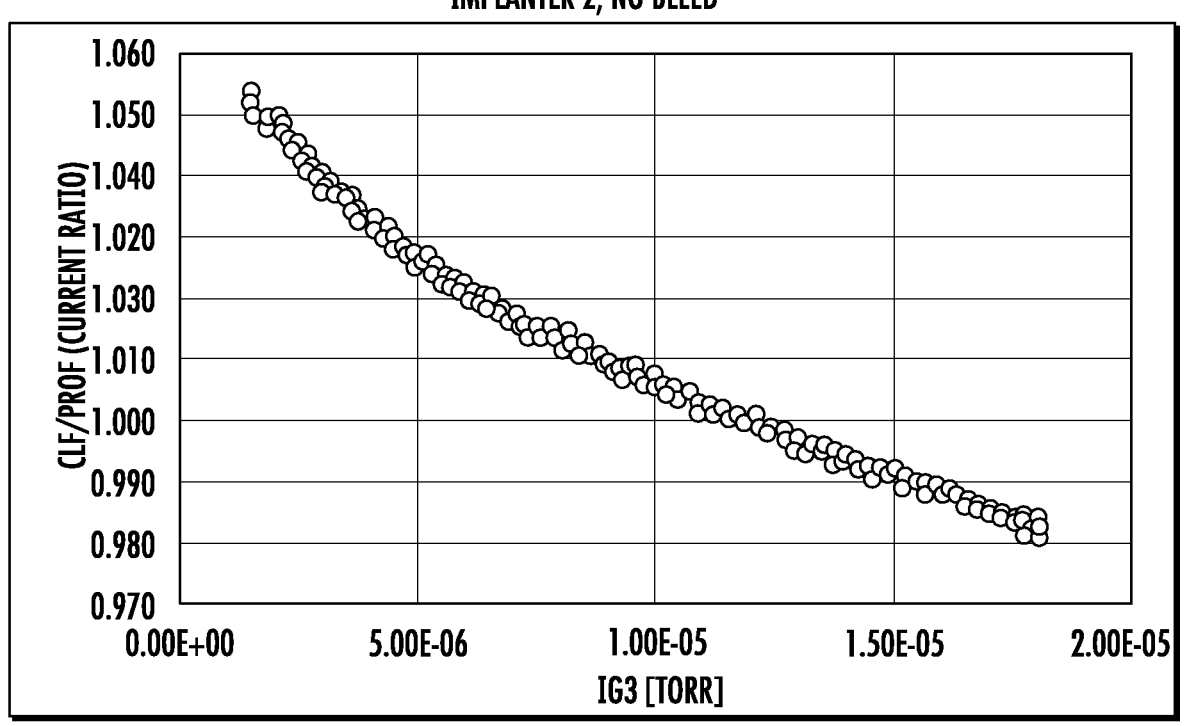

Turning to FIG. 1A-1F there are shown variations of beam current monitor parameters as a function of ambient pressure, under various scenarios. The pressure shown on the X-axis in the figures is measured at the end station housing a substrate. FIGS. 1A and 1C show the CLF currents and Profiler currents vs end station pressure during the ramping of gas pressure. In FIG. 1A, the data is taken from a first implanter configuration, while in FIG. 1C, the data is taken from a second implanter configuration. In both these configurations, no gas in bled into the implanter at upstream positions, such as at the beam scanner 110. FIGS. 1B and 1D show the variation in CLF/PF current ratio (meaning, the CLF current divided by Profiler (PF) current with the profiler detector placed at a wafer center position), for the configurations of FIG. 1a and FIG. 1C, respectively.

Figure 1E:
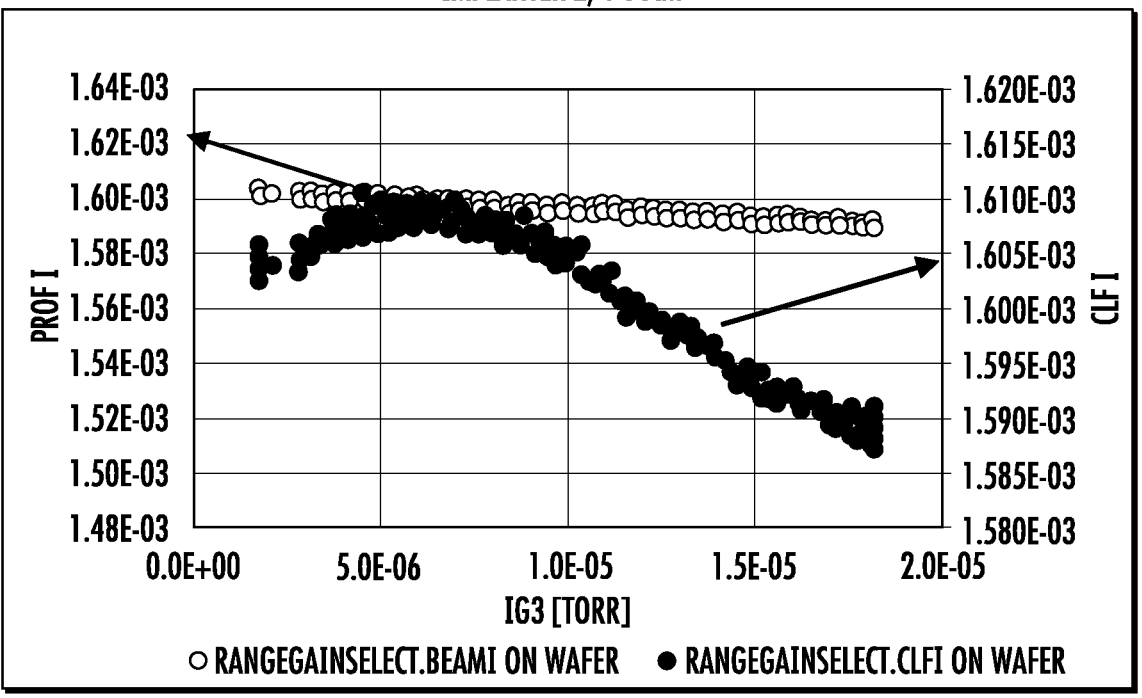
Figure 1F:
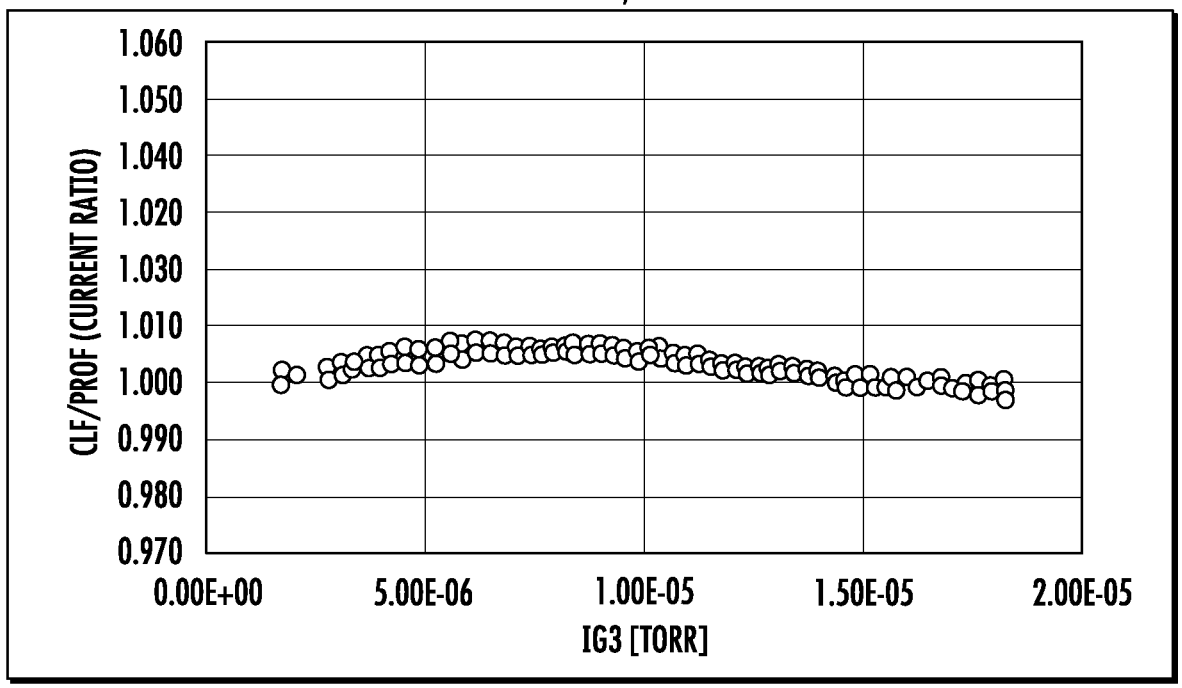

As is evident, the detected currents and the CLF/PF current ratio varies with gas pressure over a range of pressure characteristic of that pressure induced during implantation of a photoresist-coated substrate. Additionally, the variation in current and CLF/PF current ratio is greater in the implanter 2 than in the configuration of implanter 1. The CLF/PF current ratio varies several percent on implanter 2, but <0.5% on implanter 1. FIGS. 1E and 1F illustrate detected currents and current ratio, respectively, for implanter 2, where gas is bled upstream of the end station in the scanner chamber (see beam scanner 110) at a rate of 1 sccm. Adding the bleed into the scan chamber reduces the CLF/PF current ratio variation in implanter 2 to <0.5%.

In sum, the above results illustrate a strong dependence of detected current and CLF/PF current ratio on end station pressure, implanter configuration, and presence of gas bleed upstream. Notably, in cases where gas bleed is performed upstream such as in a scan chamber, the energy contamination of implanting species at the substrate may increase. Accordingly, the use of no gas bleed upstream of the end station is often useful to reduce energy contamination.

However, as shown in FIG. 1D, the actual "on wafer" current increases approximately 4% more than the detected CLF current predicts, at an expected peak outgassing pressure during implantation of a photoresist-coated wafer (approximately 10 µTorr). These results suggest that the use of a no gas bleed implantation procedure into photoresist-coated substrates in implanter 2 should be performed in a manner to overdose the substrate approximately 4% with respect an implantation procedure performed into the same substrates using a 1 sccm bleed into the scanner chamber.

Figure 2A:
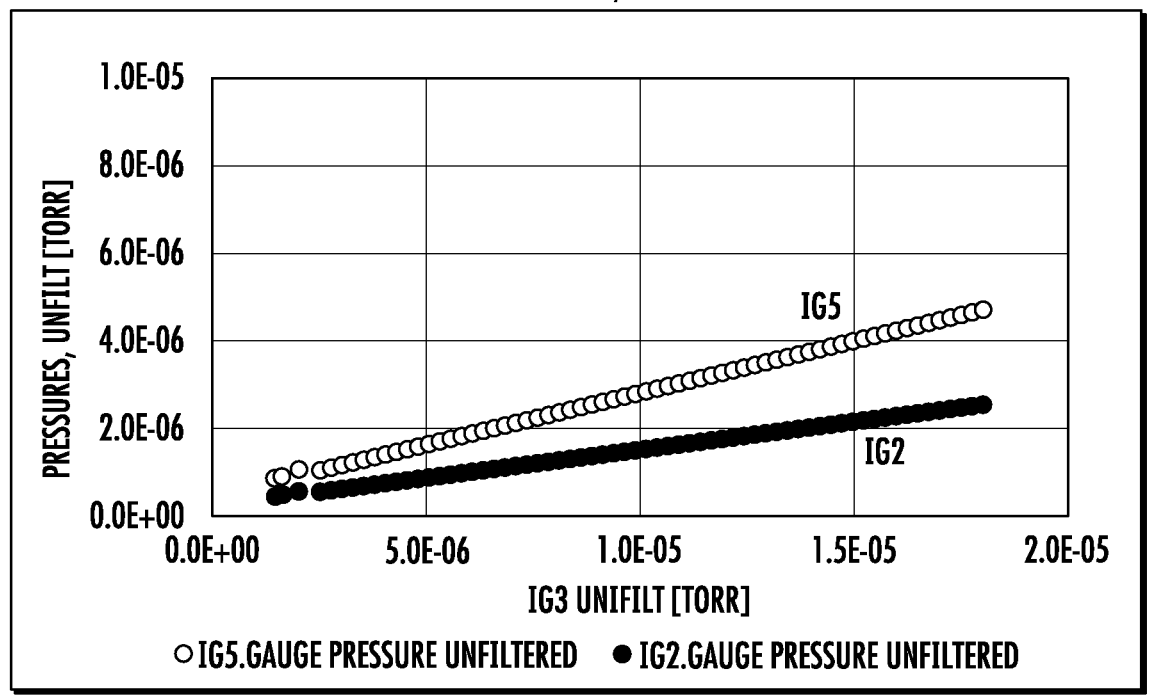
Figure 2B:
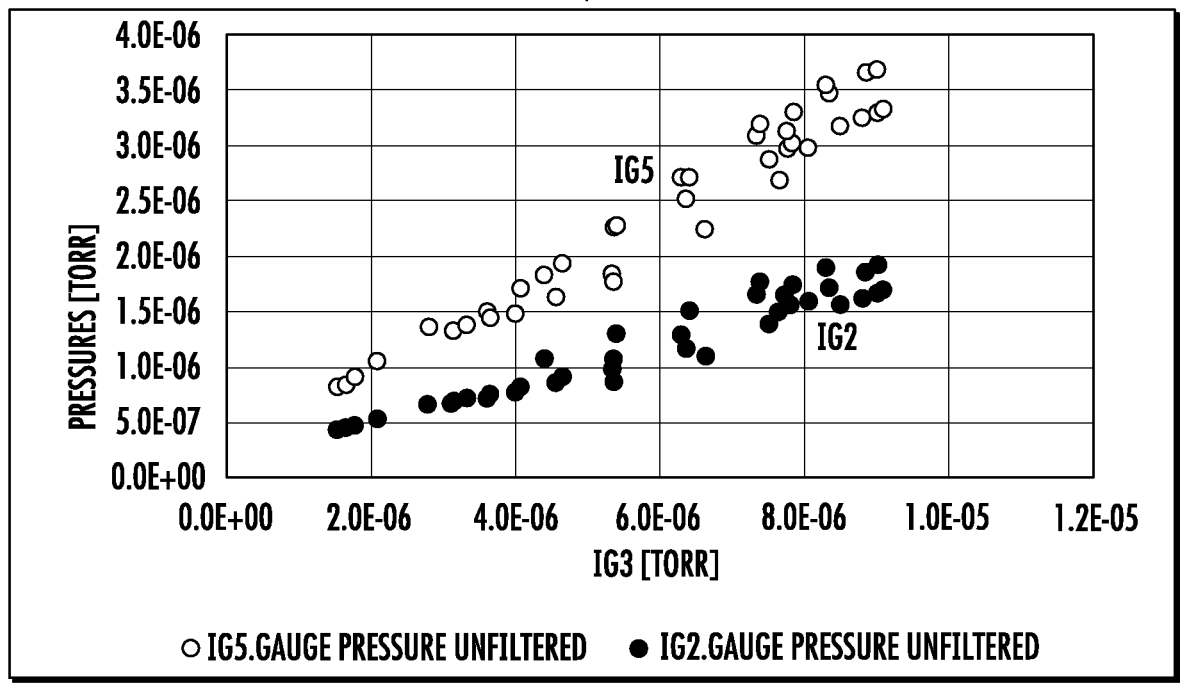
FIGS. 2B and 2D illustrate gas pressure behavior during implantation using the same measurement protocol of FIGS. 2A and 2C, respectively.
Figure 2C:
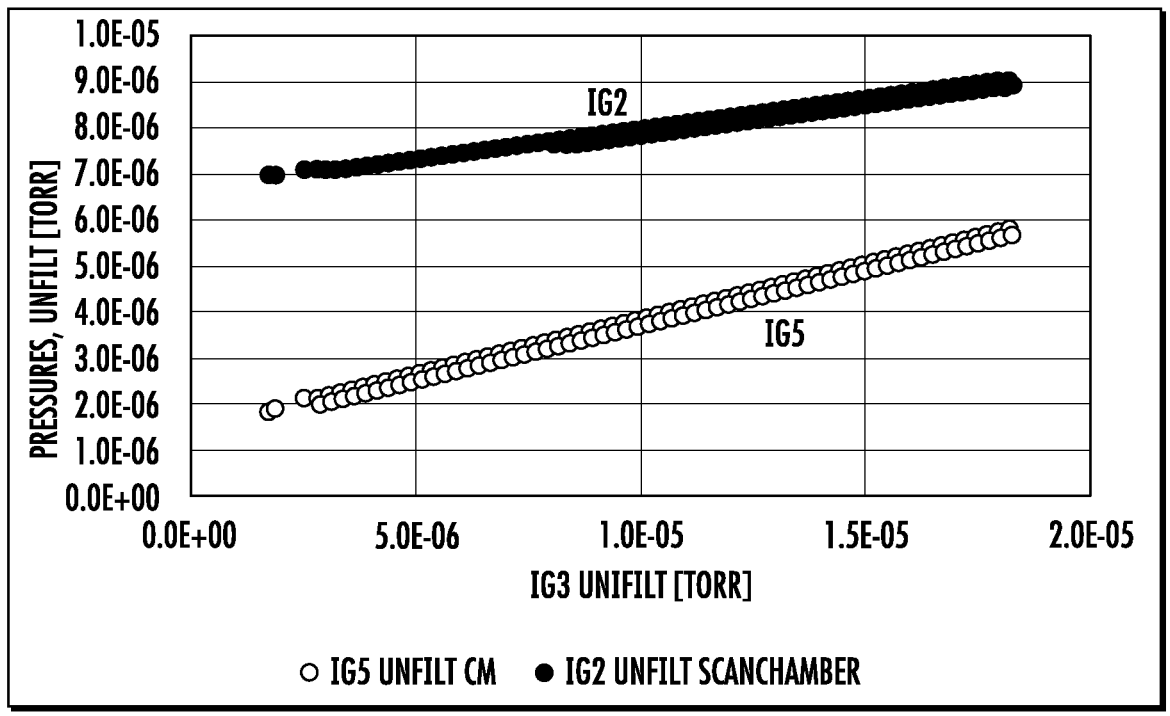
Figure 2D:
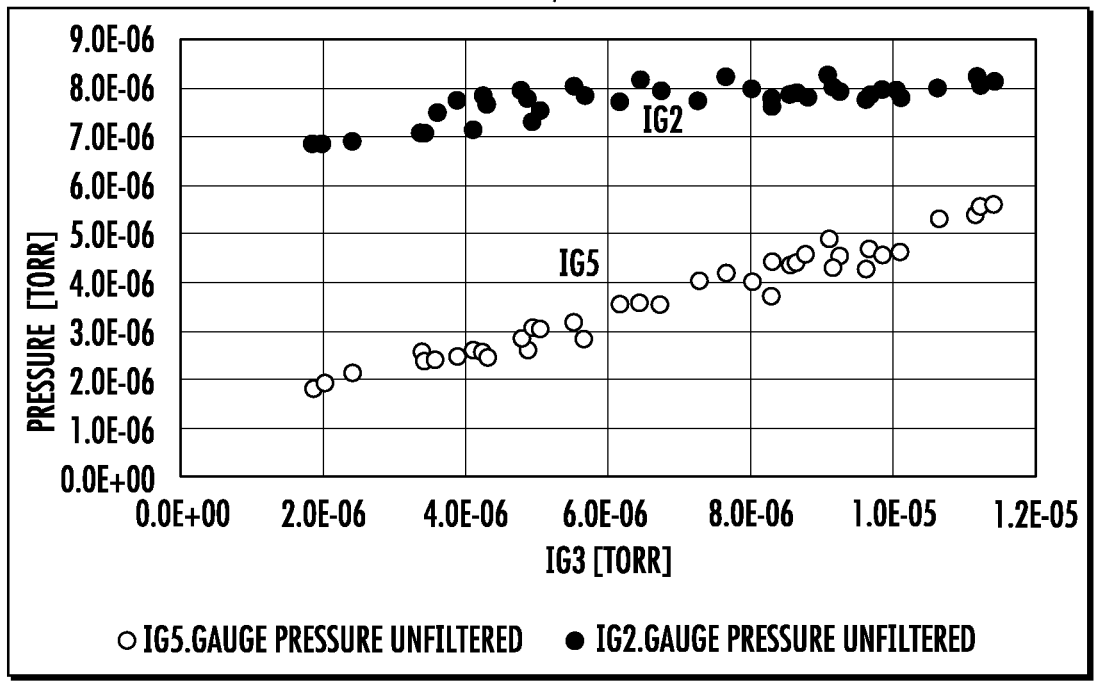

FIGS. 2A and 2C illustrate results of gas ramp calibration measurements for implanter 2 under conditions of no bleed and 1 sccm bleed, as described above, shown for two different gas pressure monitors. As discussed in the following description, controlled gas ramp experiments may be used to establish various calibration curves, including curves that express various entities, including what are termed difference ratios and/or current ratios. FIGS. 2B and 2D illustrate gas pressure behavior during implantation using the same measurement protocol of FIGS. 2A and 2C, respectively. These results show that the variation of upstream pressures vs end station pressure (IG3, on X-axis), on implanter 2, was similar for the gas ramp calibration and the actual implant test for no bleed conditions and for 1 sccm bleed.

Figure 3A:
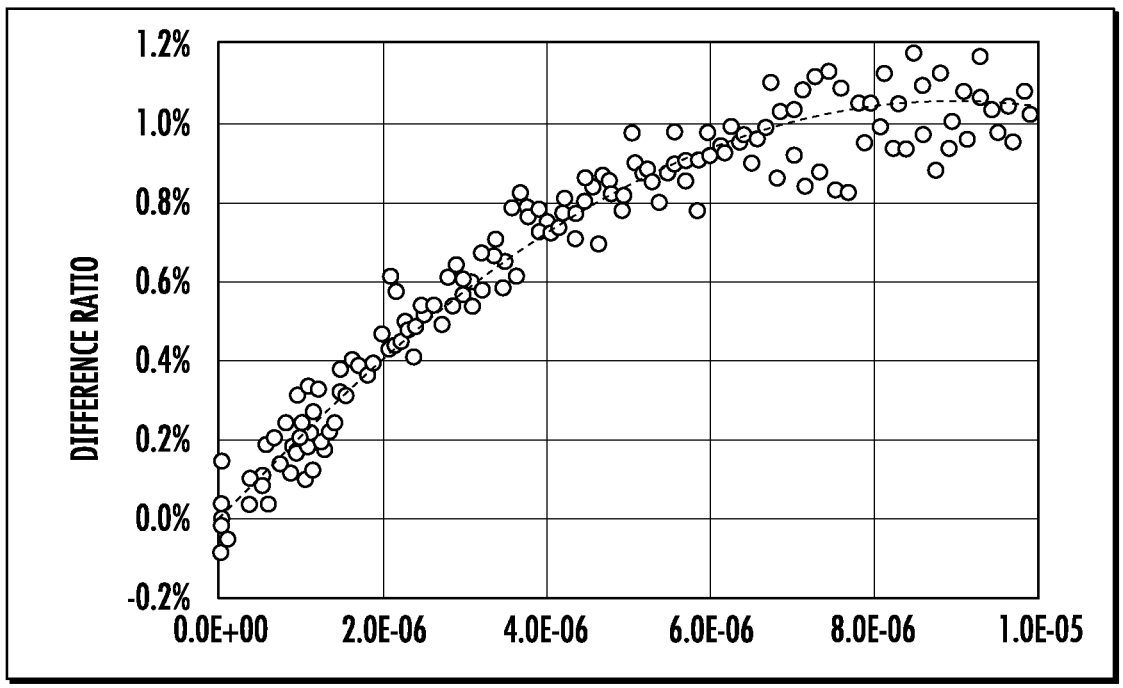
FIG. 3A and FIG. 3B show variation of current during implantation vs base current measured prior to implantation at a base pressure, for two different conditions.

FIG. 3A plots a measured implant current deviation generated by the presence of a photoresist-coated wafer, from what current value may be expected from an ion beam directed into a substrate position in the endstation in the absence of the wafer. Specifically, the Y-axis plots a ratio that is termed a difference ratio, and is defined as a difference between an instantaneous current measured by the first detector (I) at a given pressure minus a base current measured by the first detector at a base pressure before gas ramp begins (B), where the difference is divided by the base current. Said differently, the difference ratio may be expressed as (I−B)/B. In the example, the first detector is a closed loop Faraday detector (CLF) detector. As such, the pressure in the implanter endstation may be in the range of $2\times10^{-6}$ Torr of lower, at the base pressure. The data of FIG. 3A is based upon FIG. 1C, and represents the case where no bleed gas is introduced upstream of the endstation, as discussed above. The implant current is measured during implantation of a substrate by the CLF detector, positioned to the side of a substrate, after the substrate is loaded onto a substrate platen, coated with photoresist. As such, during implantation, an increase in pressure may take place, due to outgassing of the photoresist. In the data shown in FIG. 3A, an ion beam is scanned across a substrate, generating excursions in pressure as the ion beam causes the photoresist on the substrate to outgas into the endstation. The data in FIG. 3A represents data taken during implantation of just one wafer (substrate). Generally, when the ion beam is scanned across a wafer, the pressure in the endstation fluctuates with beam position, increasing from a low value of somewhat less than $2\times10^{-5}$ Torr when the beam is positioned furthest toward the edge of the wafer, to a high value of approximately $1\times10^{-5}$ Torr or so, when the beam position is in the center of the wafer. All the data points represent data derived from the instantaneously recorded pressure in the endstation, and instantaneously measured beam current recorded by the CLF monitor. Thus, the data shown represents multiple recordings taken over multiple scans of an ion beam across the wafer.

Figure 3B:
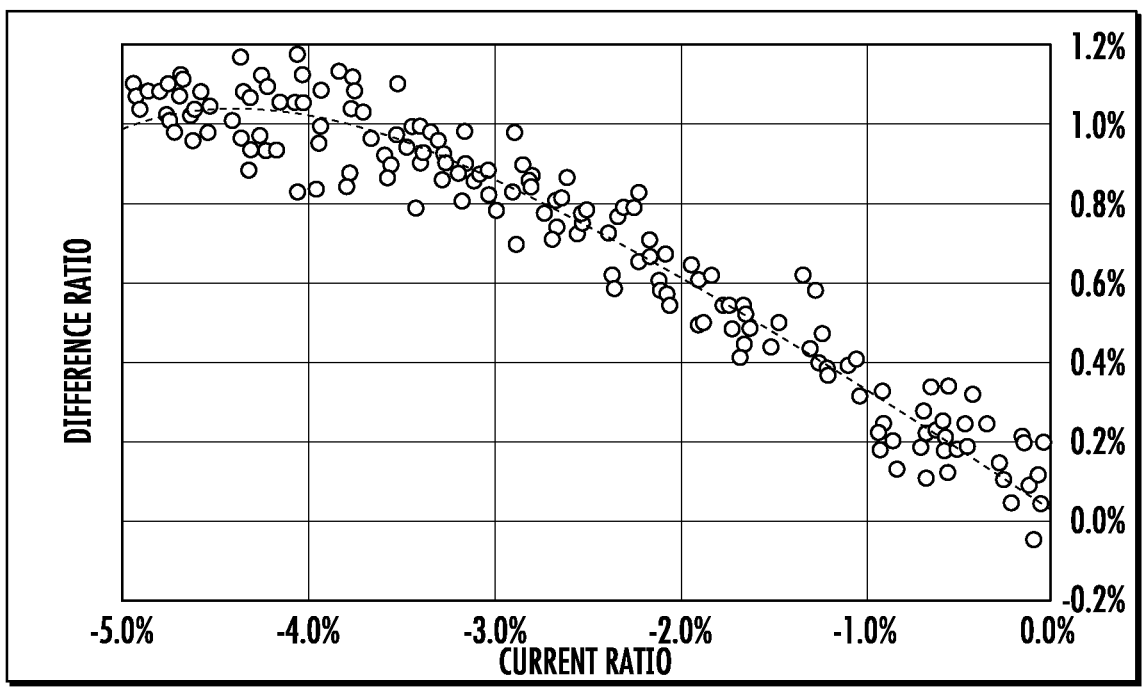

As shown in FIG. 3A, in this example, the (I−B)/B ratio increases monotonically by approximately 0.5% from the lowest pressure to the highest pressure, meaning that the measured implant current is approximately 0.5% higher than would be expected. In FIG. 3B, the difference ratio ((I−B)/B ratio) is plotted as a function of change in current ratio (in this example, the CLF current/Profile current ratio), where the negative % indicates a decrease in the CLF current/profile current ratio with respect to the ratio at a base pressure.

Thus, based upon the trends of FIGS. 3A and 3B, when the CLF current changes upon exposing a substrate coated with photoresist to an ion beam, the pressure change from the base pressure may be determined from FIG. 3A, and the % change in CLF/profile CurrentRatio from the BaseRatio may be determined from FIG. 3B. Note that the pressure change may also be used to correct for neutral effects, and may be available in a table in a program for correcting for changes in the CLF current/profile current ratio.

Thus, when a substrate such as a photoresist-coated wafer is exposed to an ion beam, such as a scanning ion beam, the change in implant current may be measured in real time by a sensor such as a CLF, where this change in implant current is used to determine a pressure change at the endstation, and a CLF current/profile current ratio change with respect to a base value. Thus, the current on wafer will be known. The neutral component of species impinging upon the substrate may be determined from the pressure change, based upon the implant current change.

Figure 4A:
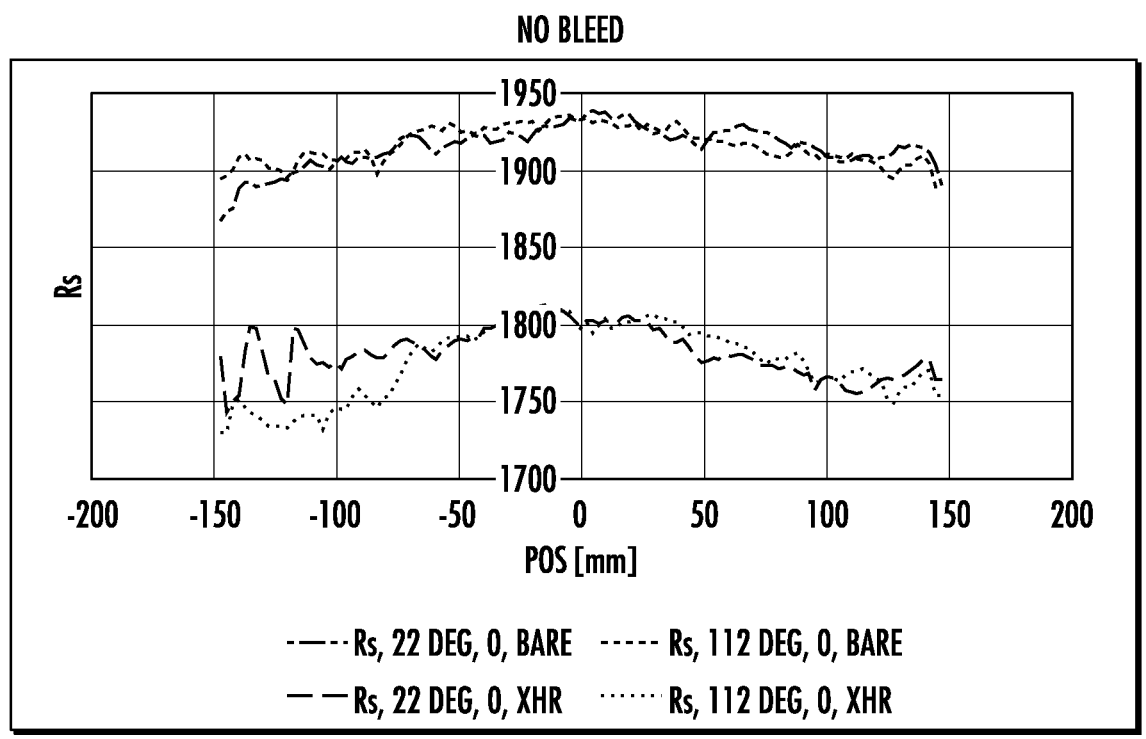
FIGS. 4A and 4B shows horizontal and vertical Rs line scans for substrates implanted under two different conditions, in comparison to reference substrates, showing an overdose implantation due to gas pressure effects.
Figure 4B:
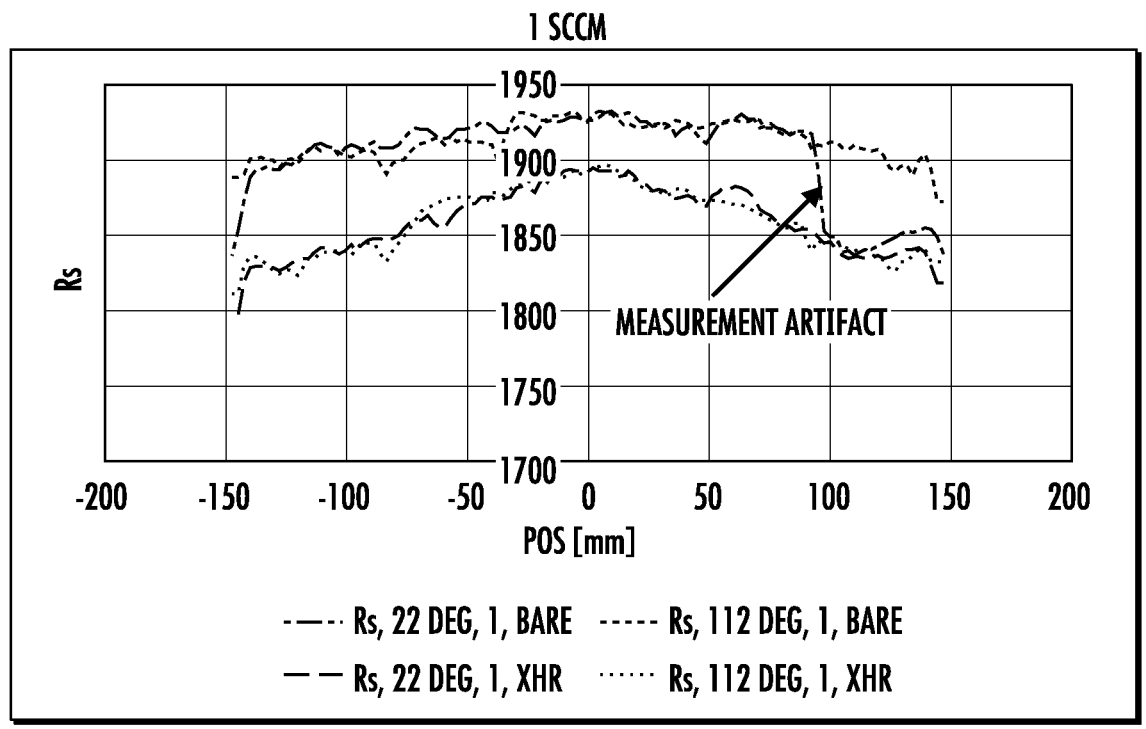

FIGS. 4A and 4B shows horizontal and vertical resistance (Rs) line scans for substrates implanted under two different conditions, in comparison to reference substrates, showing an overdose implantation due to gas pressure effects. In FIG. 4A, the upper two curves are horizontal and vertical resistance values, shown as a function of position on the substrate, for a bare implanted substrate. In this condition, the resistance is relatively higher. In FIG. 4A, the lower two lines are horizontal and vertical resistance values for an implanted substrate with photoresist, with no bleed performed upstream in the scanner chamber. As shown, the resistance values are much lower, indicating that the substrate have been overdosed by approximately 5% with respect to a target dose, as represented by the bare substrates. In FIG. 4B, where gas bleed at 1 sccm is performed during implantation, the Rs values (upper two curves) for bare substrates is the same as in FIG. 1A, as expected, while the Rs values for photoresist-coated substrates (lower two curves) are somewhat lower, indicating a smaller ion overdose, as compared to the no bleed case of FIG. 4A. The overdose difference between the two cases was predicted by the gas ramp calibration data, as reflected in the data of FIG. 1D, for example.

In summary, the above results demonstrate that the delivered dose to a substrate that is implanted with photoresist present matches the prediction for delivered dose using the CLF current/PF current ratio data derived from a gas ramp calibration that determines the CLF current/PF current ratio as a function of gas pressure in the end station. These results show that the CLF current/PF current ratio data from the gas ramp test calibration to control delivered ion dose implanted into a photoresist-coated substrate more accurately. In other words, the determined values of CLF current/PF ratio as a function of the deviation of implant current from target current can be used to deliver a more accurate dose to the wafer. Said differently, the measured % change in CLF current with respect to a setup current, at a base pressure (base current), can be used to predict the CLF current/PF current ratio variation. This approach accordingly takes the ambient pressure out of the equation, so that correction does not rely on ion gauge accuracy.

Thus, in accordance with embodiments of the disclosure, during implantation of a series of at least one wafer (or substrate) that is coated with photoresist, a current measurement may be taken, such as by a CLF monitor at the start of an implant process for each wafer, where the current measurement is translated back to actual implant current based upon the previously measured current ratio (CLF current/PF current ratio).

Thus, in order to perform dose compensation for a given ion implantation recipe according to the present embodiments, just one correction factor may be employed-a "dose compensation" factor-which factor is independent of tuning conditions. This factor takes into account the net effect of the current ratio variation (CLF_current/Profiler_current), as well as the effect of neutrals created from ions due to charge exchange interactions. The neutrals contribution to variation does not depend on setup conditions, while the current ratio variation does depend upon setup conditions. Thus, in practice, the Dose Compensation factor can vary as a function of tune conditions. The present embodiments, by measuring the current ratio variation with pressure for a given tuning condition, more accurately determines the variable part of the net Dose Compensation factor.

FIG. 5 illustrates a process flow 500, in accordance with embodiments of the disclosure. At block 510 a controlled gas ramp calibration process is performed, where, during the gas ramp calibration, a plurality of values of current ratios are measured. The current ratios represent a ratio of current measured between a first detector, located to the side of a substrate, and current measured by a second detector, located over the substrate position. In one example, the current ratio may represent the ratio of a current measured by a closed loop Faraday detector and a current measured by a profile detector. The plurality of measurements are performed as a function of pressure over a given pressure range in an endstation that houses a substrate. The given pressure range may cover the pressure range generated when an ion beam is scanned over a photoresist-coated substrate.

At block 520, during the gas ramp calibration, a plurality of values of a difference ratio are calculated over the given pressure range of the operation of block 510, where the difference ratio is defined as a difference between an instantaneous current measured by the first detector (I) at a given pressure minus a base current measured by the first detector at a base pressure before gas ramp begins (B), where the difference is divided by the base current. Said differently, the difference ratio may be expressed as (I−B)/B.

According to various embodiments of the disclosure, the operations of block 510 and 520 may be performed before a given plurality of substrates is to be implanted according to a given ion implantation recipe, and the results may be captured in tabular, graphic, or functional form to express variation of difference ratio (I−B)/(B) with pressure for the given recipe.

At block 530, the variation of difference ratio with current ratio is determined, such as for a given implantation recipe used to generate the blocks 510 and 520. In other words, for a given number of pressure values a current ratio may be determined. In particular, for each pressure value during the gas ramp calibration of blocks 520 and 530, a current ratio measurement is determined and a difference ratio is determined, so that each measured current ratio value corresponds to a difference ratio value. These different values of current ratio and difference ratio at different gas pressures may be stored as a table, function, or graph, for example, to express the dependence or variation in difference ratio with current ratio.

At block 540, an ion beam is scanned over a substrate, coated with a photoresist layer. The ion beam may be scanned over a given axis, such as an x-axis of a Cartesian coordinate system. At the same time, the substrate may scanned along a second axis, perpendicular to the first axis, such as a Y-axis. The ion beam may be scanned using an implant recipe that is employed during the gas ramp calibration of blocks 510 and 520. In some examples, the ion beam may be scanned back and forth at a given rate, such as 0.5 kHz to 5 kHz according to some non-limiting embodiments. At the same time, a substrate may be scanned at a scan rate wherein scanning of the substrate from one end to an opposite end under the ion beam may entail a duration of several tenths of seconds to several seconds. As such, the ion beam may be scanned back and forth along the first direction several hundred times during the duration that the substrate scans from one end to an opposite end. As such, during the scanning of a substrate, such as a circular substrate, the outgassing from photoresist may increase as the substrate moves from a position where just the edge of the substrate is scanned under the ion beam to the position where the widest part of the substrate is scanned under the ion beam. Accordingly, gas pressure may vary during the scanning of the substrate from one end to another.

In accordance with different embodiments, the substrate of block 540 and those blocks to follow may be one substrate of a plurality of substrates to be implanted according to a recipe used to generate the information at blocks 510 and 520.

At block 550, the implant current is measured during the scanning of the ion beam over the substrate, using the first detector, positioned to the side of the substrate position. The implant current may be measured instantaneously for a large number of instances during an individual scan of the substrate under the ion beam, such as tens or hundreds of times. Said differently, during the duration of say one second for scanning of the substrate along a second axis under an ion beam that is scanning along a first axis, perpendicularly to the second axis, measurements of implant current may be performed by a first detector every few milliseconds.

At block 560, a value of the difference ratio is determined based upon implant current (I) measured by the first detector during the scanning of the substrate and ion beam. The value of difference ratio may be determined for a number of implant current values such as for each implant current measurement of block 550 in some non-limiting examples. The value of the difference ratio may be determined based upon the value of base current of block 520. In this operation, calculation of the difference ratio proceeds generally as in the calibration operation of block 520, while at block 560, the values of difference ratio are based upon instantaneous implant current (I) measured by the first detector during actual implantation, where the value of B is as described at block 520, and the base current (B) represents base current measured at the start of an implant, before the substrate is scanned under the ion beam.

At block 570, at a plurality of instances during the scanning of the ion beam and substrate, a current ratio (CR) is determined between the first detector and the second detector, by mapping the calculated difference ratio to a difference ratio/current ratio curve or function, or table, as determined at block 530. The current ratio may be determined for multiple instances during a given scan, such as for each implant current measurement collected by the first detector.

At block 580, a corrected current is calculated based upon the current ratio measured at a plurality of instances in block 570. the scanning of the ion beam is then adjusted based upon the corrected current using the current ratio determined at block 570. For example, a plurality of values of CR may be determined over a plurality of instances during scan of a substrate. These values of CR facilitate a determination of how far the measured ion current (measured by the first detector, positioned to the side of the substrate) deviates from the on-substrate current, during the first scan. More particularly, for a given scan (or plurality of scans), the ion dose on a substrate (scan dose) is proportional to the current on the substrate multiplied by scan time, where the current on the substrate is calculated based upon the current (I) measured by the first detector multiplied by the current ratio. As in known approaches, the scan speed for a given scan may be based on the average on-wafer current recorded from a fixed number of previous scans, prior to the given scan. For any given scan, the on-wafer current=(CLF Current for that scan)/(CR for that CLF Current).

In summary, the present embodiments provide various advantages for correcting implantation conditions, including a first advantage of using just one correction factor to adjust conditions. A further advantage is provided in that correction of ion dose does not rely upon ion gauge accuracy, since measurement of pressure drift with time is indirectly accounted for in the dose compensation factor.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
using a first implant recipe to perform an implant by scanning an ion beam along a first axis over a substrate, coated with a photoresist layer, while the substrate is scanned along a second axis, perpendicular to the first axis;
measuring an implant current (I) during the implant at a plurality of instances, using a first detector, positioned to a side of a substrate position;
determining at the plurality of instances a value of a difference ratio based upon the implant current, the difference ratio given by (I−B)/(B), where B is current measured by the first detector, during a calibration at base pressure without the substrate present;
determining a plurality of values of a current ratio (CR) during the implant for the plurality of instances, respectively, based upon the difference ratio, the current ratio being a ratio of the implant current to a current measured by a second detector, positioned over the substrate position, during the calibration; and
adjusting the scanning the ion beam, the scanning of the substrate, or a combination thereof, based upon the current ratio.

2. The method of claim 1, wherein the determining the value of the current ratio comprises mapping the difference ratio to a current ratio curve, expressing (I−B)/(B) as a function of CR.

3. The method of claim 2, wherein the current ratio curve is determined by:
measuring, for a plurality of instances during a gas ramp calibration, a plurality of values the current ratio, as a function of pressure over a given pressure range in an endstation housing the substrate; and
determining, for the plurality of instances, a plurality of values of the difference ratio over the given pressure range.

4. The method of claim 1, wherein the first detector is a closed loop current detector.

5. The method of claim 1, wherein the scanning is adjusted by:
determining a scan dose of a first scan based upon the plurality of values of CR; and
adjusting a scan speed for a second scan, subsequent to the first scan, based upon the scan dose of the first scan.

6. The method of claim 5, wherein the scanning is adjusted by:
adjusting the scan speed for the second scan, based upon the scan dose of the first scan and a plurality of scan doses, determined for a predetermined plurality of scans, prior to the first scan.

7. An ion implanter, comprising:
an ion source to generate an ion beam according to an implant recipe;
a scanner to scan the ion beam;
a first detector and a second detector to measure current of the ion beam;
a substrate stage to scan a substrate; and
a controller to control the ion beam, the controller arranged to:
perform an implant by scanning the ion beam along a first axis over a substrate, coated with a photoresist layer, while the substrate is scanned along a second axis, perpendicular to the first axis;
measure an implant current (I) during the implant at a plurality of instances, using a first detector, positioned to a side of a substrate position;
determine at the plurality of instances a value of a difference ratio based upon the implant current, the difference ratio given by (I−B)/(B), where B is current measured by the first detector, during a calibration at base pressure without the substrate present;
determine a plurality of values of a current ratio (CR) for the plurality of instances during the implant, respectively, based upon the difference ratio, the current ratio being a ratio of the implant current to a current measured by a second detector, positioned over the substrate position, during the calibration; and
adjust the scanning the ion beam, the scanning of the substrate, or a combination thereof, based upon the current ratio.

8. The ion implanter of claim 7, wherein a value of the current ratio is determined by mapping the difference ratio to a current ratio curve, expressing (I−B)/(B) as a function of CR.

9. The ion implanter of claim 8, wherein the current ratio curve is determined by:
measuring, for a plurality of instances during a gas ramp calibration, a plurality of values the current ratio, as a function of pressure over a given pressure range in an endstation housing the substrate; and
determining, for the plurality of instances, a plurality of values of the difference ratio over the given pressure range.

10. The ion implanter of claim 7, wherein the first detector is a closed loop current detector.

11. The ion implanter of claim 7, wherein the scanning is adjusted by:
determining a scan dose of the first scan based upon the plurality of values of CR; and
adjusting a scan speed for a second scan, subsequent to the first scan, based upon the scan dose of the first scan.

12. The ion implanter of claim 11, wherein the scanning is adjusted by:
adjusting the scan speed for the second scan, based upon the scan dose of the first scan and a plurality of scan doses, determined for a predetermined plurality of scans, prior to the first scan.

13. A method of implanting a substrate, comprising:
using a first implant recipe to perform an implant by scanning an ion beam along a first axis over a substrate, while the substrate is scanned along a second axis, perpendicular to the first axis;
measuring an implant current (I) during the implant, using a first detector, positioned to a side of a substrate position;
determining a value of a difference ratio based upon the implant current, the difference ratio given by (I−B)/(B), where B is current measured by the first detector, during a calibration at base pressure;
determining a value of a current ratio (CR) during the implant, based upon the difference ratio, the current ratio being a ratio of the implant current to a current measured by a second detector, positioned over the substrate position, during the calibration; and
adjusting the scanning the ion beam, the scanning of the substrate, or a combination thereof, based upon the current ratio.

14. The method of claim 13, wherein the determining the value of the current ratio comprises mapping the difference ratio to a current ratio curve, expressing (I−B)/(B) as a function of CR.

15. The method of claim 14, wherein the current ratio curve is determined by:
measuring, for a plurality of instances during a gas ramp calibration, a plurality of values the current ratio, as a function of pressure over a given pressure range in an endstation housing the substrate; and
determining, for the plurality of instances, a plurality of values of the difference ratio over the given pressure range.

16. The method of claim 13, wherein the first detector is a closed loop current detector.

17. The method of claim 13, wherein the scanning is adjusted by:
determining a scan dose of the first scan based upon the plurality of values of CR; and
adjusting a scan speed for a second scan, subsequent to the first scan, based upon the scan dose of the first scan.

18. The method of claim 17, wherein the scanning is adjusted by:
adjusting the scan speed for the second scan, based upon the scan dose of the first scan and a plurality of scan doses, determined for a predetermined plurality of scans, prior to the first scan.

* * * * *